(12) United States Patent
Jin et al.

(10) Patent No.: US 12,080,706 B2
(45) Date of Patent: Sep. 3, 2024

(54) SEMICONDUCTOR DEVICE FOR A LOW-LOSS ANTENNA SWITCH

(71) Applicant: TAIWAN SEMICONDUCTOR MANUFACTURING CO., LTD., Hsinchu (TW)

(72) Inventors: Jun-De Jin, Hsinchu (TW); Tzu-Jin Yeh, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/853,616

(22) Filed: Jun. 29, 2022

(65) Prior Publication Data
US 2022/0328473 A1      Oct. 13, 2022

Related U.S. Application Data

(62) Division of application No. 16/874,536, filed on May 14, 2020, now Pat. No. 11,380,680.

(60) Provisional application No. 62/873,650, filed on Jul. 12, 2019.

(51) Int. Cl.
*H01L 27/06*      (2006.01)
*H01L 29/06*      (2006.01)
*H01L 29/423*      (2006.01)

(52) U.S. Cl.
CPC ...... *H01L 27/0629* (2013.01); *H01L 29/0653* (2013.01); *H01L 29/4238* (2013.01)

(58) Field of Classification Search
CPC ..... H01L 23/66; H01L 29/78; H01L 23/3171; H01L 27/0207; H01L 29/0603; H01L 21/823481; H01L 27/0629; H01L 29/0653; H01L 29/4238; H01L 21/76224; H01L 29/1087; H01L 2223/6677; H01L 29/0649
See application file for complete search history.

(56) References Cited

U.S. PATENT DOCUMENTS

| | | | |
|---|---|---|---|
| 6,130,139 A * | 10/2000 | Ukeda | H01L 21/76232 257/E21.549 |
| 6,207,998 B1 | 3/2001 | Kawasaki et al. | |
| 6,213,869 B1 | 4/2001 | Yu et al. | |
| 7,348,830 B2 | 3/2008 | Debroux | |
| 9,583,168 B1 | 2/2017 | Wang et al. | |
| 9,673,187 B2 | 6/2017 | Salcedo et al. | |
| 2002/0093054 A1 | 7/2002 | Yeh et al. | |
| 2002/0125537 A1 | 9/2002 | Wong et al. | |
| 2004/0164354 A1 | 8/2004 | Mergens et al. | |

(Continued)

FOREIGN PATENT DOCUMENTS

| | | |
|---|---|---|
| CN | 102214693 A | 10/2011 |
| CN | 105720060 A | 6/2016 |

(Continued)

*Primary Examiner* — Galina G Yushina
(74) *Attorney, Agent, or Firm* — Maschoff Brennan

(57) ABSTRACT

A semiconductor device includes a substrate, a first metal-oxide-semiconductor device and a at least one first resistor. The substrate includes a non-doped region. The first metal-oxide-semiconductor device extends into the substrate. The first metal-oxide-semiconductor device is adjacent to the non-doped region. The at least one first resistor is disposed right above the non-doped region and arranged in a first row aligned with the first metal-oxide-semiconductor device in a first direction.

20 Claims, 9 Drawing Sheets

(56) References Cited

U.S. PATENT DOCUMENTS

| | | |
|---|---|---|
| 2005/0221787 A1 | 10/2005 | Wong et al. |
| 2006/0035611 A1* | 2/2006 | Connell .............. H03D 7/1441 455/209 |
| 2007/0034967 A1* | 2/2007 | Nayfeh .............. H01L 29/7833 257/369 |
| 2007/0146048 A1 | 6/2007 | Debroux |
| 2008/0087978 A1 | 4/2008 | Coolbaugh et al. |
| 2008/0157119 A1 | 7/2008 | Tsai |
| 2009/0023263 A1* | 1/2009 | Phan .............. H01L 28/20 257/E21.004 |
| 2010/0001351 A1 | 1/2010 | Zhang et al. |
| 2010/0068873 A1 | 3/2010 | Lin et al. |
| 2010/0207679 A1 | 8/2010 | Okashita |
| 2011/0187475 A1 | 8/2011 | Kim et al. |
| 2012/0098593 A1* | 4/2012 | Downey .............. H01C 17/22 327/567 |
| 2013/0102138 A1* | 4/2013 | Yeh .............. H01L 21/823807 438/585 |
| 2013/0271223 A1 | 10/2013 | Hsieh et al. |
| 2014/0021560 A1* | 1/2014 | Su .............. H01L 27/0629 257/E21.616 |
| 2014/0104132 A1 | 4/2014 | Bakalski et al. |
| 2014/0167218 A1 | 6/2014 | Mallikarjunaswamy et al. |
| 2014/0242760 A1* | 8/2014 | Carroll .............. H01L 21/84 438/155 |
| 2015/0084117 A1 | 3/2015 | Bobde |
| 2015/0381122 A1* | 12/2015 | Musa .............. H01L 23/66 257/536 |
| 2016/0181265 A1 | 6/2016 | Regnier et al. |
| 2016/0240536 A1 | 8/2016 | Lee et al. |
| 2016/0300830 A1 | 10/2016 | Salcedo et al. |
| 2017/0256529 A1* | 9/2017 | Tanuma .............. H01L 29/7304 |
| 2018/0114801 A1 | 4/2018 | Leipold et al. |
| 2019/0304937 A1 | 10/2019 | Jin |
| 2020/0395383 A1 | 12/2020 | Willard |

FOREIGN PATENT DOCUMENTS

| | | |
|---|---|---|
| JP | 2003-152098 A | 5/2003 |
| JP | 2006-518941 A | 8/2006 |
| JP | 2009164460 A | 7/2009 |
| JP | 201496583 A | 5/2014 |
| KR | 20090031354 A | 3/2009 |
| TW | 200828446 A | 7/2008 |
| TW | 201013846 A | 4/2010 |
| TW | 201630126 A | 8/2016 |

* cited by examiner

SEMICONDUCTOR DEVICE FOR A LOW-LOSS ANTENNA SWITCH

CROSS-REFERENCE TO RELATED APPLICATION

This is a divisional application of U.S. application Ser. No. 16/874,536, filed May 14, 2020, now U.S. Pat. No. 11,380,680, issued on Jul. 5, 2022, which claims priority to U.S. Provisional Patent Application No. 62/873,650, filed on Jul. 12, 2019, which is incorporated by reference herein in its entirety.

BACKGROUND

In radio transmission devices like cell phones and wireless systems, antenna switches thereof are significant components for routing high frequency signals through transmission paths. The antenna switch is usually combined with a power amplifier and both functions integrated within the same integrated circuit. In some approaches, the transmitted signals couple from one node to another through a substrate. The substrate that is susceptible to substrate noise coupling may be described as having a low insertion loss, where insertion loss is a decrease in transmitted signal. In low noise circuits for mixed signal and system-on-chip (SOC) designs, trace insertion loss become more challenging for the semiconductor device design and manufacture.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
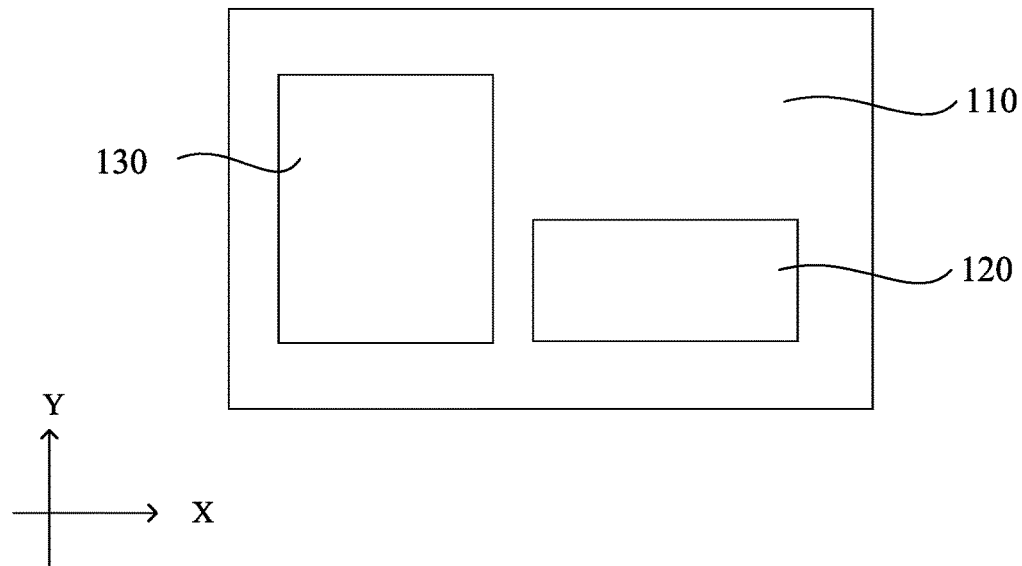
FIG. 1 is a top view diagram of part of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

In some embodiments, the present disclosure provides some implements to reduce insertion loss (IL) of an antenna switch without changing a circuit design of the antenna switch. In some embodiment, an isolation feature is disposed adjacent a metal-oxide-semiconductor (MOS) device on a substrate. Alternatively stated, less metal like element being disposed adjacent the device which receives and transmits signals further improves IL performance. In one embodiment, non-implanted semiconductor structures are arranged adjacent to the MOS. In another embodiments, semiconductor structures, such like dummy gates or dummy active areas, are arranged adjacent to the MOS. Before the silicide formation process, a resist protect oxide (RPO) layer is formed above the semiconductor structures to prevent the structures under the RPO layers to be silicided. In yet another embodiment, one terminal of the MOS corresponding to a substrate is set floated or coupled to a resistor. In yet another embodiment, multiple MOSs are separated from each other with a predetermined spacing. The resistors coupled to the MOSs have a predetermined width and the resistors are separated from each other with another predetermined spacing. In yet another embodiment, the substrate includes a non-doped region. The resistor(s) is disposed in metal layers above the non-doped region. In yet another embodiment, shallow trench isolations and the MOS extend into the substrate, while the shallow trench isolations have a depth greater than a depth of the MOS. In yet another embodiment, the substrate has a high resistivity. In the other embodiment, the MOS has an enlarged pitch between gate structures thereof, and conductive segments configured as drain/source terminal of the MOS have an enlarged width.

Each of the above-mentioned embodiments can improve IL performance of the antenna switch based on a process technique without changing a circuit design of the antenna switch. The above-mentioned embodiments may be applied independently or in any combination. They improve IL performance without incurring any additional cost or any additional process complexity, or chip area penalty. The present disclosure is applicable to any semiconductor process technology for antenna switch, including but not limited to the fin field-effect transistor (FinFET) which is the next technology for 28 GHz 5G cellular networks.

Reference is now made to FIG. 1. FIG. 1 is a top view diagram of part of a semiconductor device 100, in accordance with some embodiments. In some embodiments, the semiconductor device 100 is formed to serve as an antenna switch. For illustration, the semiconductor device 100 includes a substrate 110, a metal-oxide-semiconductor device (MOS) 120, and a feature 130 disposed adjacent to the MOS 120. In some embodiments, a conductivity of the feature 130 is smaller than a conductivity of the substrate 110. In various embodiments, the feature 130 extends into the substrate 110 with a first depth, and the metal-oxide-semiconductor device 120 extends into the substrate 110 with a second depth smaller than the first depth.

In some embodiments, the substrate 110 is pure silicon structure. In various embodiments, the substrate 110 includes other elementary semiconductors such as germanium. The substrate 110 includes a compound semiconductor such as silicon carbide, gallium arsenic, indium arsenide, and indium phosphide. Various implements of the substrate 110 are included in the contemplated scope of the present disclosure. For example, in some embodiments, the substrate 110 includes an alloy semiconductor such as silicon germanium, silicon germanium carbide, gallium arsenic phosphide, and gallium indium phosphide.

Figure 2:
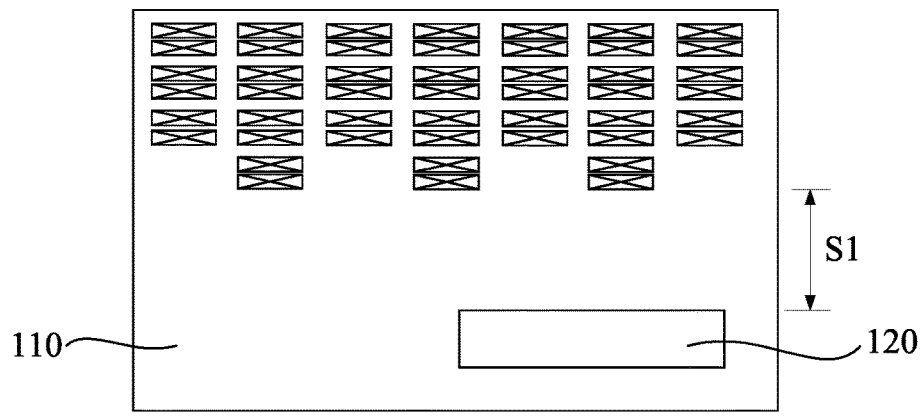
FIG. 2 is a top view diagram of part of a semiconductor device, in accordance with some embodiments.

Reference is now made to FIG. 2. FIG. 2 is a top view diagram of part of a semiconductor device 200 corresponding to the semiconductor device 100 of FIG. 1, in accordance with some embodiments. With respect to the embodiments of FIG. 1, like elements in FIG. 2 are designated with the same reference numbers for ease of understanding.

As shown in FIG. 2. For illustration, the semiconductor device 200 includes multiple dummy structures 230 on the substrate 110. In some embodiments, the dummy structures 230 are configured with respect to, for example, the feature 130 of FIG. 1. The dummy structures 230 are arranged apart from the MOS by a distance S1. In some embodiment, the distance S1 ranges from about 1 to about 100 micrometers.

In some embodiments, the dummy structures 230 include, for example, pure silicon structures. The dummy structures 230 are arranged in y direction in a form of an array. In some embodiments, the dummy structures 230 are placed pair by pair, as shown in FIG. 2. For example, two of the dummy structures 230 in one pair are much closer to each other, compared with another two of the dummy structures 230 in another pair.

In some approaches, some dummy structures are disposed adjacent the MOS for further chemical mechanical polish (CMP) process on the MOS. However, those dummy structures are P-type-doped or/and N-type-doped and are arranged by automation placing utility. In such arrangements, based on some experiment results, an antenna switch having doped dummy structures induces insertion loss (IL) of about 1.00 dB. With the configurations of the present disclosure shown in FIG. 2, the semiconductor device 200 reduces the IL to about 0.97 dB. Accordingly, the IL performance is improved by about 0.03 dB, compared to the antenna switch in some approach.

The configurations of FIG. 2 are given for illustrative purposes. Various implements are within the contemplated scope of the present disclosure. For example, in some embodiments, the dummy structures 230 are arranged adjacent the MOS 120 in x direction and separated from the MOS 120 with the distance S1. In various embodiments, all of the dummy structures 230 are apart from each other by a uniform spacing in both x and y directions.

Figure 3:
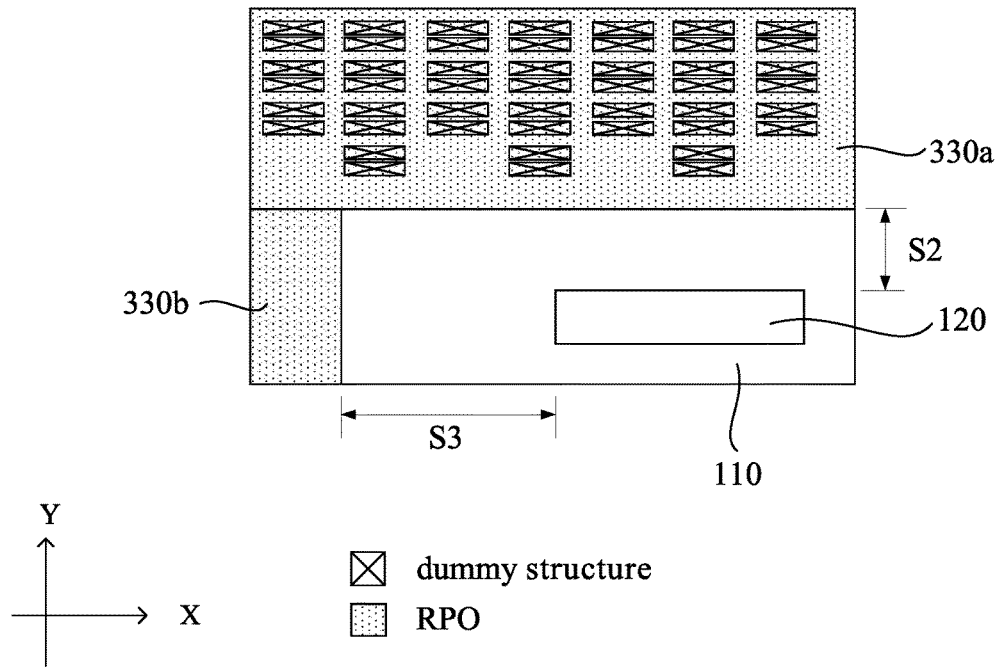
FIG. 3 is a top view diagram of part of a semiconductor device, in accordance with some embodiments.

Reference is now made to FIG. 3. FIG. 3 is a top view diagram of part of a semiconductor device 300 corresponding to the semiconductor device 100 of FIG. 1, in accordance with some embodiments. With respect to the embodiments of FIGS. 1-2, like elements in FIG. 3 are designated with the same reference numbers for ease of understanding.

As illustratively shown in FIG. 3, a resist protect oxide (RPO) layer including two portions 330a-330b is formed over the dummy structures 230. In some embodiments, the dummy structures 230 and the resist protect oxide (RPO) layer portions 330a-330b in the embodiments of FIG. 3 are configured with respect to, for example, the feature 130 of FIG. 1. The portion 330a is separated from the MOS 120 by a distance S2 in y direction. The portion 330b is separated from the MOS 120 by a distance S3 in x direction. In some embodiments, the distances S2-S3 are the same. In some alternative embodiments, the distances S2-S3 are different. In yet alternative embodiments, the distances S2-S3 range from about 1 to about 100 micrometers.

In some embodiments, areas and structures covered by the RPO layer portions 330a-330b are not silicided in the process. Alternatively stated, the areas of the semiconductor device 300 are divided into areas that are to be silicided for electrical contacts and other areas that are not to be silicided. Accordingly, the dummy structures 230 under the RPO layer portion 330a are not silicided. In some embodiments, the RPO layer portions 330a-330b are formed using silicon dioxide.

In some approaches, some dummy structures are disposed adjacent the MOS are silicided and further have conductive features disposed thereon. In such arrangements, based on some experiment results, an antenna switch having silicided dummy structures induces insertion loss (IL) of about 1.1 dB. In contrast, with the configurations of the present disclosure shown in FIG. 3, the semiconductor device 300 reduces the IL to about 1.0 dB. Accordingly, the IL performance is improved by about 0.1 dB, compared to the antenna switch in some approach.

The configurations of FIG. 3 are given for illustrative purposes. Various implements are within the contemplated scope of the present disclosure. For example, in some embodiments, there are the dummy structures 230 arranged under the RPO layer portion 330b.

Figure 4:
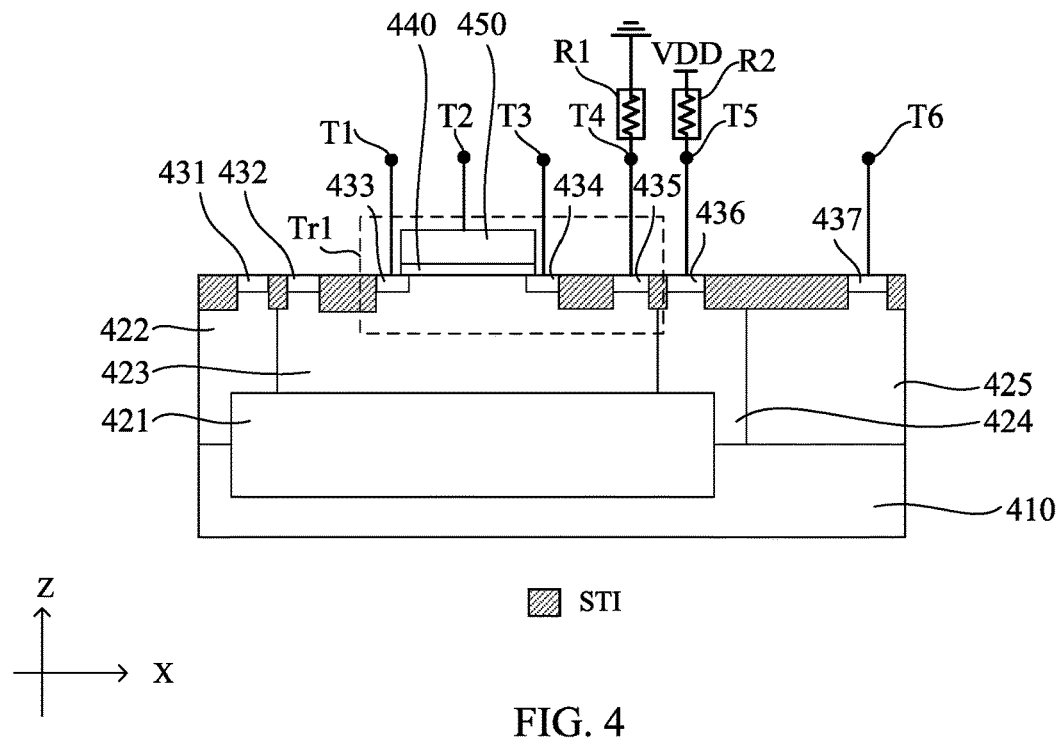
FIG. 4 is a cross-section view diagram of part of a semiconductor device, in accordance with some embodiments.

Reference is now made to FIG. 4. FIG. 4 is a cross-section view diagram of part of a semiconductor device 400 corresponding to the semiconductor device 100 of FIG. 1, in accordance with some embodiments.

For illustration, the semiconductor device 400 includes a substrate including a lower portion 410 of the substrate, wells 421-425, shallow trench isolations STI, doped regions 431-437, a gate oxide layer 440, a gate structure 450, and resistors R1-R2. In some embodiments, the substrate including the lower portion 410 of the substrate is configured with respect to, for example, the substrate 110 of FIG. 1.

As shown in FIG. 4, the wells 421-425 are disposed within the substrate including a lower portion 410 of the substrate. The well 423 is arranged above the well 421. The well 424 is further interposed between the wells 423 and 425. In some embodiments, the well 421 is a deep N-doped well (N-well), in which the deep N-well represents a conductive sub-surface well layer that is beneath the surface well 423. The wells 422 and 424 are N-doped wells. The wells 423 and 425 are P-doped wells (P-wells).

The doped region 431 is disposed in the well 422. The doped regions 432-435 are disposed in the well 423. The doped region 436 is disposed in the well 424. The doped region 437 is disposed in the well 425. The doped regions 431-437 are separated by the shallow trench isolations STI. In some embodiments, the doped regions 431, 433-434, and 436 are N-doped. The doped regions 432, 435, and 437 are P-doped.

As shown in FIG. 4, the gate 450 is disposed above the gate oxide layer 440. In some embodiments, the gate 450 is formed as a polysilicon (or poly) layer. In some embodiments, the gate 450 further includes a gate dielectric layer (not shown) and a metal gate layer (not shown). In some embodiments, the gate 450 includes one or more metal layers in place of the poly layer. In various embodiments, the gate oxide layer 440 includes a dielectric material including, for example, silicon oxide ($SiO_2$) or silicon oxynitride (SiON), and is able to be formed by chemical oxidation, thermal oxidation, atomic layer deposition (ALD), chemical vapor deposition (CVD), and/or other suitable methods. In some embodiments, the polysilicon layer is formed by suitable deposition processes including, for example, low-pressure chemical vapor deposition (LPCVD) and plasma-enhanced CVD (PECVD). In some embodiments, the gate dielectric layer uses a high-k dielectric material including, for example, hafnium oxide ($HfO_2$), $Al_2O_3$, lanthanide oxides, $TiO_2$, HfZrO, $Ta_2O_3$, $HfSiO_4$, $ZrO_2$, $ZrSiO_2$, combinations thereof, or other suitable material, and the gate dielectric layer is formed by ALD and/or other suitable methods. The metal gate layer includes a p-type work function metal or an n-type work function metal, and is deposited by CVD, PVD, and/or other suitable process. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The one or more metal layers use aluminum (Al), tungsten (W), copper (Cu), cobalt (Co), and/or other suitable materials; and are formed by CVD, PVD, plating, and/or other suitable processes. The formations and/or materials associated with the gate 450 and the gate oxide layer 440 are given for illustrative purposes. Various formations and/or materials associated with the gate 450 and the gate oxide layer 440 are within the contemplated scope of the present disclosure.

In some embodiments, the doped regions 433-435, the gate oxide layer 440, and the gate 450 are included in a transistor TR1. In some embodiments, the transistor TR1 is configured with respect to, for example, the MOS 120 of FIG. 1. The doped regions 433-435 are configured in the formations of a drain terminal T1, a source terminal T3, and a body terminal T4 of the transistor TR1 separately. The gate 450 corresponds to a gate terminal T2 of the transistor TR1. In some embodiments, the doped region 436 is configured in the formation of a terminal T5 corresponding to the wells 421 and 424, and the doped region 437 is configured in the formation of a terminal T6 corresponding to the substrate including a lower portion 410 of the substrate. Alternatively stated, the MOS device includes six terminals T1-T6 in operation.

In some embodiments, the gate terminal T2, the terminals T4-T6, or the combination thereof is configured to be electrically coupled to a resistor(s) or to be floated. For example, in the embodiments of FIG. 4, the body terminal T4 is coupled to the resistor R1 and further to the ground. The terminal T5 is coupled to the resistor R2 and further to a signal, e.g. a voltage VDD. In some embodiments, the terminal T6 is floated. In various embodiments, the terminal T6 is coupled to a resistor configured with respect to, for example, the resistors R1-R2. In some embodiments, the resistors R1-R2 have a resistance of about 500 to about 1,000,000 ohms. Alternatively stated, the resistors R1-R2 are resistors of sufficiently high value to effectively float the substrate.

In some approaches, as at least one of terminals corresponding to terminals T4-T6 is coupled to the ground, substrate noise coupling degrades the performance of the semiconductor device. For example, when the terminal T6 is grounded, a portion of a signal supposed to be transmitted from the drain to source flows from the wells 423-425 to the doped region 437, another portion of the signal flows from the wells 423, 421, 424-425 to the doped region 437, and the other portion of the signal flows from the wells 423,421, the lower portion 410 of the substrate, and the well 425 to the doped region 437. In contrast, with the configurations of FIG. 4, based on some experiment results, an antenna switch, having the terminal T6 being floated or coupled to a resistor, reduces the IL about 1.0 dB, compared to the antenna switch in some approach. In addition, when the terminals T5-T6 are both floated or coupled to the resistors, there is further a reduction of about 1.0 dB to the IL, with respect to only the terminal T6 floated. Moreover, when the terminals T4-T6 are all floated or coupled to the resistors, there is further a reduction of about 1.0 dB to the IL, with respect to the terminals T5-T6 floated. Accordingly, the IL performance is much improved, compared to the antenna switch in some approach.

The configurations of FIG. 4 are given for illustrative purposes. Various implements are within the contemplated scope of the present disclosure. For example, in some embodiments, the wells 421-422 and 424 are P-doped wells. The wells 423 and 425 are N-doped wells. The doped regions 431, 433-434, and 436 are P-doped. The doped regions 432, 435, and 437 are N-doped.

Figure 5:
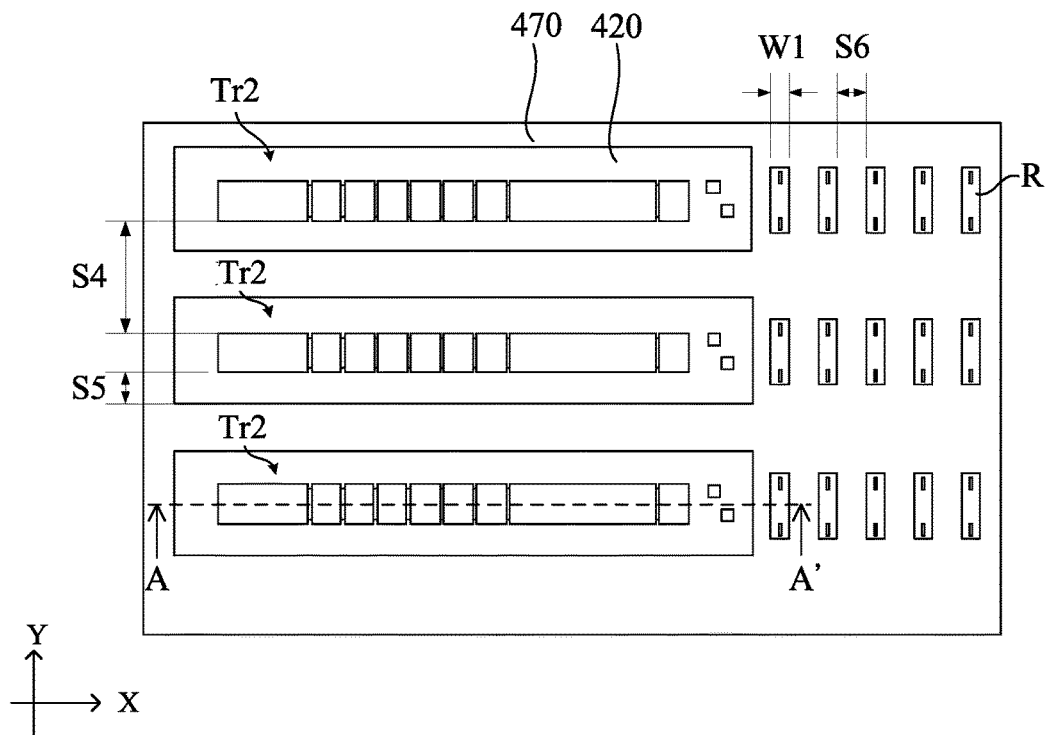
FIG. 5 is a top view diagram of part of the semiconductor device, in accordance with some embodiments.

Reference is now made to FIG. 5. FIG. 5 is a top view diagram of part of the semiconductor device 400, in accordance with some embodiments. With respect to the embodiments of FIG. 4, like elements in FIG. 5 are designated with the same reference numbers for ease of understanding.

As shown in FIG. 5, for illustration, the semiconductor device 400 further includes wells 420, a non-doped region 470, resistors R, and transistors TR2. In some embodiments, the wells 420 are configured with respect to, for example, the wells 421-425 of FIG. 4. The non-doped region 470 corresponds to a region of the substrate including the lower portion 410 of the substrate. The resistors R are configured with respect to, for example, the resistors R1-R2 of FIG. 4. The transistors TR2 are configured with respect to, for example, the transistor TR1 having six terminals of FIG. 4. In various embodiments, one of the transistor TR2 is implemented by coupling multiple transistors TR1 in parallel.

For illustration, the transistors TR2 are disposed within the wells 420 which extend in x direction. The transistors TR2 are apart from each other by a distance S4 in a layout view. In some embodiments, the distance S4 ranges from about 0.001 to about 5 micrometers. In some embodiments, each of the transistors TR2 has a MOS height of about 1.5 micrometers in y direction.

As shown in FIG. 5, the wells 420 are enclosed with the non-doped region 470 in the layout view. The transistors TR2 are separated from the non-doped region 470 by a distance S5. In some embodiments, the distance S5 is about 1 micrometer, but the present disclosure is not limited thereto. In some embodiments, the non-doped region 470 is referred to as non-doped Si (NTN) area in the substrate including the lower portion 410 of the substrate. The detail of the non-doped region 470 will be discussed with cross-section diagram in FIG. 6.

The resistors R are arranged above the non-doped region 470. As discussed above, the non-doped region 470 corresponds to the non-doped region in the substrate including the lower portion 410 of the substrate. Alternatively stated, no P-well or N-well is arranged under the resistors R. Accordingly, in the embodiments above, the influence of the substrate noise coupling to the resistors R is reduced due to the distance, provided by the non-doped region, between the doped region of the substrate including the lower portion 410 of the substrate and the resistors R. The IL is correspondingly improved.

For illustration, the resistors R in a row are aligned with the transistor TR2 in x direction. As shown in FIG. 5, the resistors R are separated from each other in x direction with a distance S6, and each of the resistors R has a width W1. In some embodiments, the distance S6 ranges from about 0.001 to about 10 micrometers. The width W1 ranges from about 0.001 to about 10 micrometers.

In some approaches, resistors having a wider width, compared with ones in the present disclosure, suffer from the substrate noise coupling. In contrast, with the configurations of the present disclosure of FIG. 5, the resistors have a reduced width and closer spacing between each other. Accordingly, the insertion loss due to the parasitic capacitance between the substrate and the resistors is reduced. The IL is correspondingly improved. For example, based on some experiment results, the induced IL drops about 0.2 dB when a width of resistors in an antenna switch changes from about 0.36 to about 0.06 micrometers.

The configurations of FIG. 5 are given for illustrative purposes. Various implements are within the contemplated scope of the present disclosure. For example, in some embodiments, the resistors R are arranged on two opposite sides of the transistors TR2.

Figure 6:
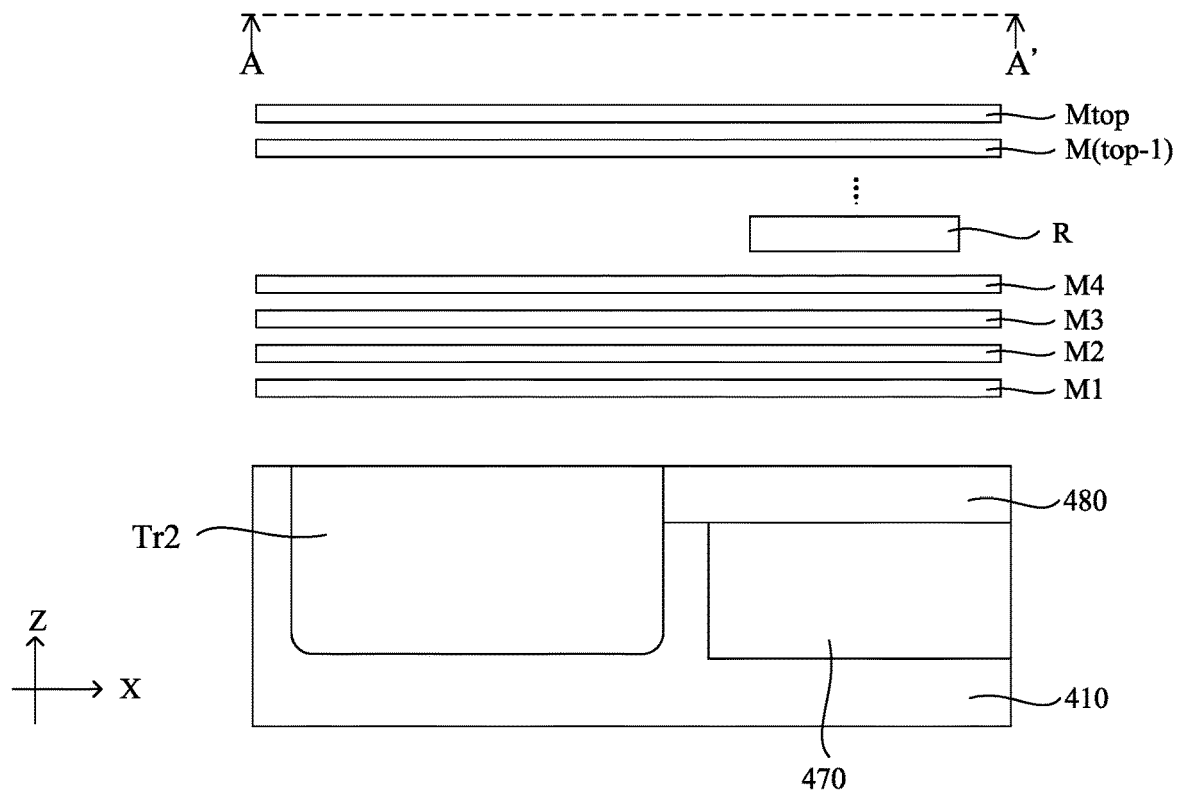
FIG. 6 is a cross-section view diagram of part of the semiconductor device in FIG. 5, in accordance with some embodiments.

Reference is now made to FIG. 6. FIG. 6 is a cross-section view diagram of part of the semiconductor device 400 along line AA' in FIG. 5, in accordance with some embodiments. With respect to the embodiments of FIGS. 4-5, like elements in FIG. 6 are designated with the same reference numbers for ease of understanding. For the sake of brevity, FIGS. 6-10 merely show only a part of a transistor (e.g., transistor TR2 and MOS 920) that is disposed within a substrate (such as only source, drain and channel), in which other portions of the transistor(s) are omitted.

For illustration, the semiconductor device 400 further includes multiple thick metal layers M1-M4, M(top-1), and Mtop and an isolation 480. In some embodiments, there are more metal layers between the metal layers M4 and M(top-1). The metal layers M1-M4, M(top-1), and Mtop are configured for metal routing between devices included in the semiconductor device 400. In alternative embodiments, the isolation 480 is implemented by, for example, a shallow trench isolation or dummy active area, and is configured with respect to, for example, the feature 130 of FIG. 1.

As shown in FIG. 6, the metal layers M1-M4, M(top-1), and Mtop are arranged above the transistor TR2 and the isolation 480 in z direction. The resistor R is arranged in a position of the metal layers. In some embodiments, the resistor R is arranged above at least one of the metal layers. Alternatively stated, as shown in FIG. 6, the resistor R is arranged in a back-end-of-line (BEOL) portion, in which BEOL is the final portion of the IC fabrication process where the individual devices (transistors, capacitors, resistors, etc.) are interconnected with vias and conductive traces, e.g., metal layers M1-M4, M(top-1) and Mtop.

For illustration, the non-doped region 470 is arranged below the isolation 480. As discussed above, in some embodiments, the non-doped region 470 is non-doped silicon region of the substrate including the lower portion 410 of the substrate, including a semiconductor material, e.g. silicon, that has a higher impedance than that of an extrinsic semiconductor, e.g. a p-type semiconductor or a n-type semiconductor in the rest region of the substrate including the lower portion 410 of the substrate. As such, compared to an antenna switch with p-type well or n-type well under the isolation 480, the resistor R and surrounding the transistor TR2, the semiconductor device 400 in FIG. 6 has a higher substrate impedance that leads to a reduced parasitic loss of the transistor TR2. This reduces the amount of RF leakage through the substrate including the lower portion 410 of the substrate, which in turn improves the IL performance of the semiconductor device 400.

The configurations of FIG. 6 are given for illustrative purposes. Various implements are within the contemplated scope of the present disclosure. For example, in some embodiments, another pair of the isolation 480 and the non-doped region 470 are arranged on both opposite sides of the transistor TR2 in FIG. 6.

Figure 7:
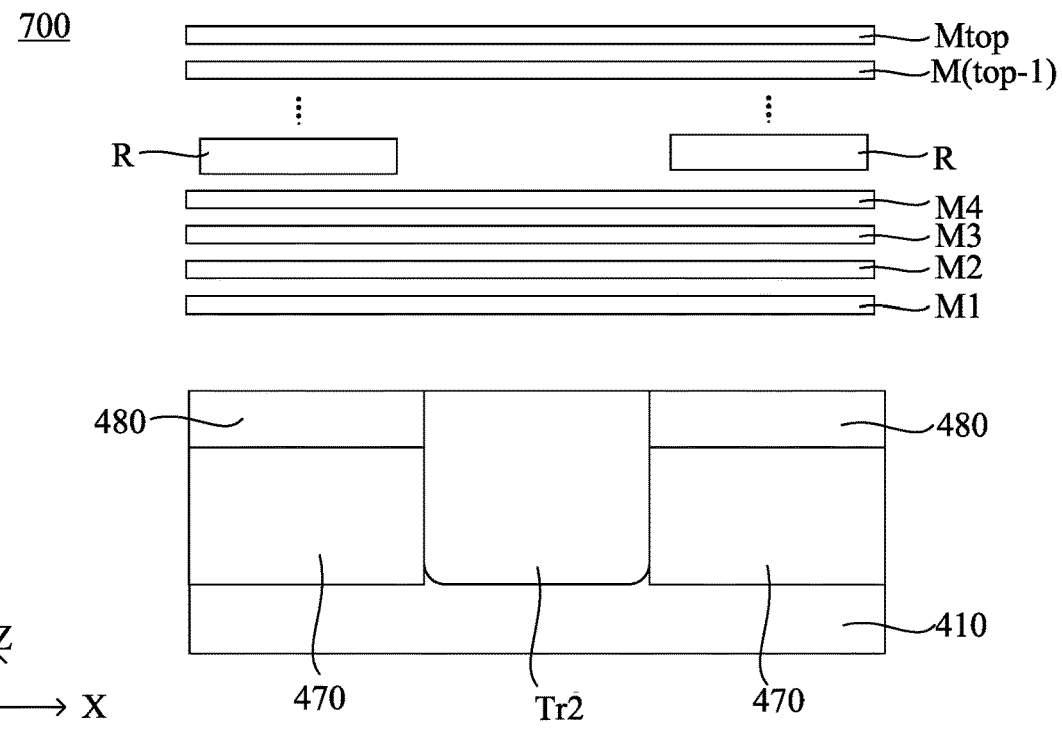
FIG. 7 is a cross-section view diagram of part of a semiconductor device corresponding to that in FIG. 5, in accordance with various embodiments.

Reference is now made to FIG. 7. FIG. 7 is a cross-section view diagram of part of a semiconductor device 700 corresponding to that in FIG. 5, in accordance with various embodiments. With respect to the embodiments of FIGS. 4-6, like elements in FIG. 7 are designated with the same reference numbers for ease of understanding.

Compared with FIG. 6, the isolations 480 and the non-doped regions 470 are arranged on both opposite sides of the transistor TR2 and adjacent the transistor TR2 in FIG. 7. The resistors R are further disposed above the non-doped regions 470 on both opposite sides of the transistor TR2.

The configurations of FIG. 7 are given for illustrative purposes. Various implements are within the contemplated scope of the present disclosure. For example, in some embodiments, the resistors R are arranged in the position of the metal layer M2.

Figure 8:
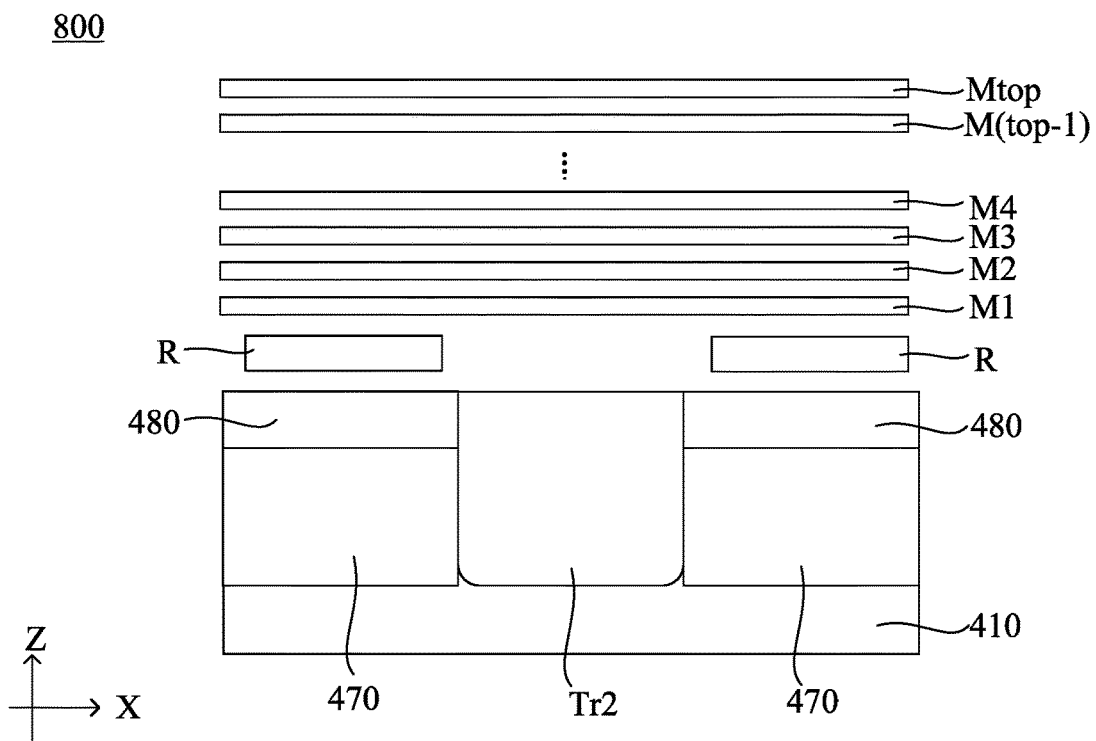
FIG. 8 is a cross-section view diagram of part of a semiconductor device corresponding to that in FIG. 5, in accordance with various embodiments.

FIG. 8 is a cross-section view diagram of part of a semiconductor device 800 corresponding to that in FIG. 5, in accordance with various embodiments. With respect to the embodiments of FIGS. 4-7, like elements in FIG. 8 are designated with the same reference numbers for ease of understanding.

Compared with FIG. 7, the resistors R in the semiconductor device 800 are arranged between the isolations 480 and the metal layer M1. In some embodiments, the resistors R are disposed in middle-end-of-line (MEOL) portion, in which MEOL provides contacts (including the shared contacts) between the gates and source/drain regions of the devices.

Figure 9:
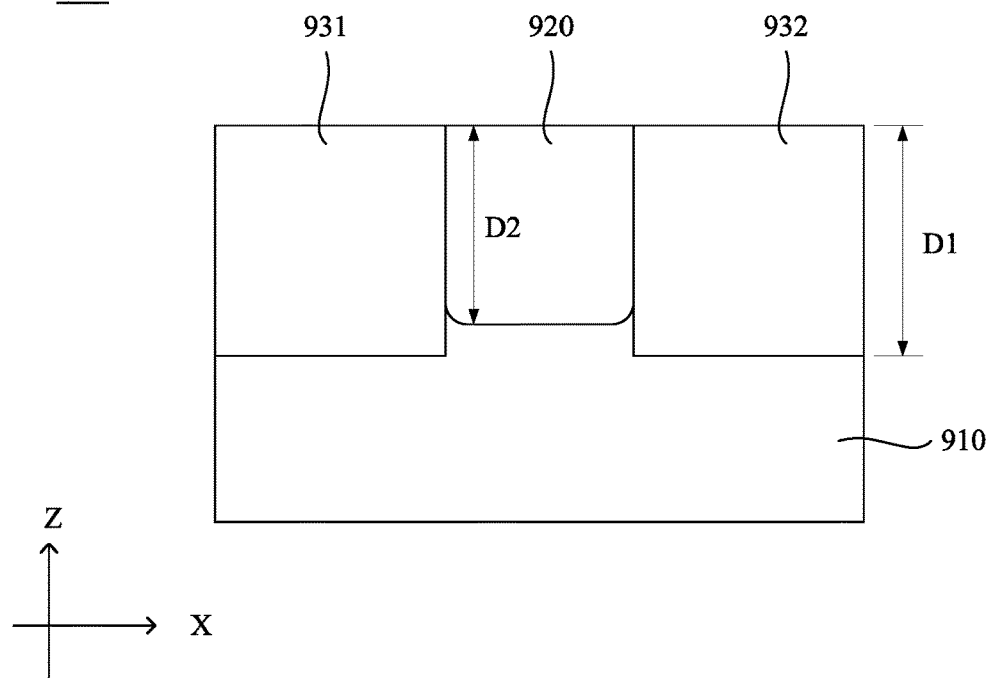
FIG. 9 is a cross-section view diagram of part of a semiconductor device, in accordance with some embodiments.

Reference is now made to FIG. 9. FIG. 9 is a cross-section view diagram of part of a semiconductor device 900 corresponding to the semiconductor device 100 of FIG. 1, in accordance with some embodiments. For illustration, the semiconductor device 900 includes a substrate 910, a MOS 920, and features 931-932. In some embodiments, the substrate 910 is configured with respect to, for example, the substrate 110 of FIG. 1. The MOS 920 is configured with respect to, for example, the MOS 120 of FIG. 1. The features 931-932 are configured with respect to, for example, the feature 130 of FIG. 1.

For illustration, the MOS 920 and the features 931-932 extend into the substrate 910 in z direction, and the features 931-932 are disposed at the opposite sides of the MOS 920. In some embodiments, the features 931-932 include shallow trench isolations. As shown in FIG. 9, the features 931-932 extend into the substrate 910 with a depth D1, and the MOS 920 extends into the substrate 910 with a depth D2. In some embodiments, the depth D1 is greater than the depth D2. In various embodiments, the depths D1-D2 ranges from about 0.5 to about 10 micrometers.

The configurations of FIG. 9 are given for illustrative purposes. Various implements are within the contemplated scope of the present disclosure. For example, in some embodiments, the depths of the features 931-932 are different due to the actual design.

Figure 10:
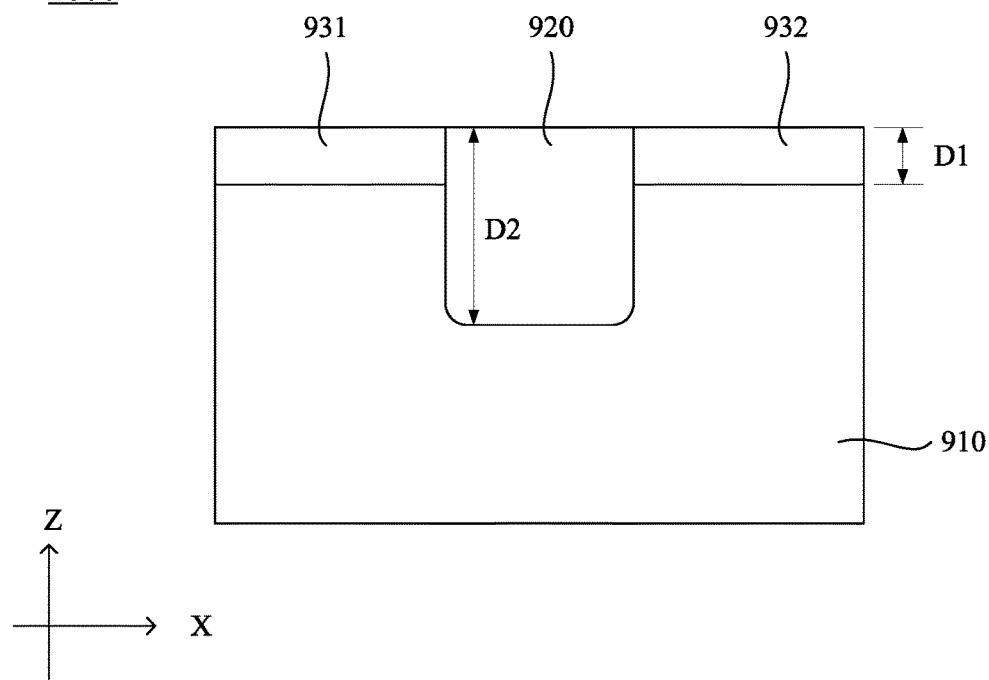
FIG. 10 is a cross-section view diagram of part of a semiconductor device, in accordance with some embodiments.

Reference is now made to FIG. 10. FIG. 10 is a cross-section view diagram of part of a semiconductor device 1000 corresponding to the semiconductor device 100 of FIG. 1, in accordance with some embodiments. With respect to the embodiments of FIG. 9, like elements in FIG. 10 are designated with the same reference numbers for ease of understanding.

Compared with FIG. 9, the depth D1 is smaller than the depth D2. In some embodiments, the substrate 910 is further has a high resistivity ranging from about 100 to about 1,000,000 ohm-cm. In some embodiments, the substrate 910 includes a silicon wafer having a low doping concentration (e.g., a doping concentration that is less than $10^{10}$ atoms/$cm^{-3}$).

In some embodiments, the IL due to the source-, drain-, and channel-to-substrate capacitances varies depending on the effective value of substrate resistance, with IL decreasing as the substrate resistance increases. The substrate resistance depends on substrate resistivity and layout. Accordingly, compared to some approaches including an antenna switch with a low-resistivity substrate, an antenna switch with the configurations of FIG. 10 reduces the IL about 0.5 dB.

The configurations of FIG. 10 are given for illustrative purposes. Various implements are within the contemplated scope of the present disclosure. For example, in some embodiments, the substrate 910 further includes the regions 470 as shown in FIG. 8 to further improve the IL performance of the semiconductor device 1000.

Figure 11:
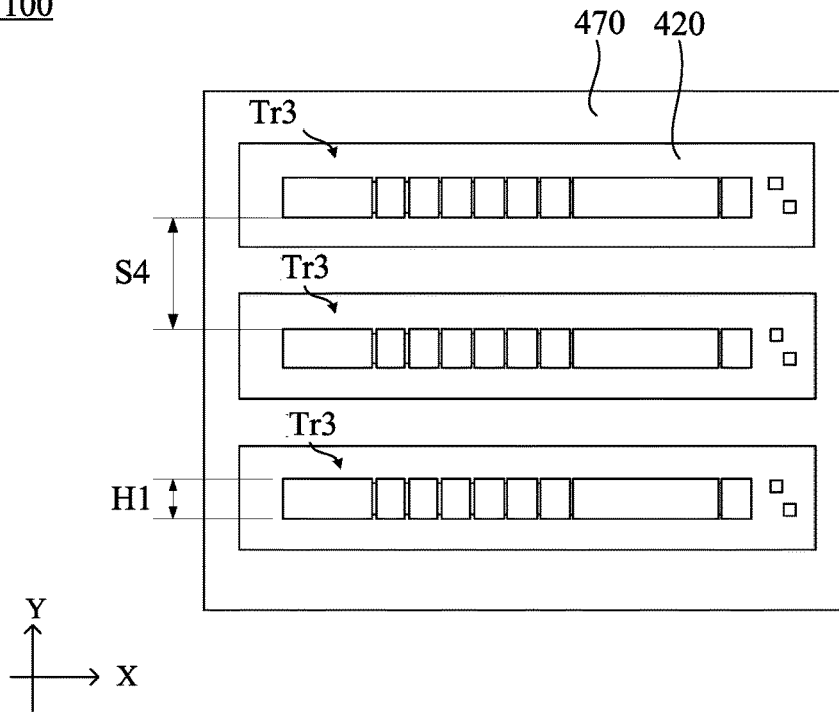
FIG. 11 is a top view diagram of part of a semiconductor device, in accordance with some embodiments.

Reference is now made to FIG. 11. FIG. 11 is a top view diagram of part of a semiconductor device 1100 corresponding to the semiconductor device 100 of FIG. 1, in accordance with some embodiments. With respect to the embodiments of FIG. 4, like elements in FIG. 11 are designated with the same reference numbers for ease of understanding.

Compared with FIG. 4, instead of having the resistors R and the transistors TR2, the semiconductor device 1100 includes transistors TR3. In some embodiments, the configurations of the transistors TR2-TR3 are different. In various embodiments, the configurations of the transistors TR2-TR3 are the same. In yet various embodiments, one transistor TR3 is a combination of more than 30 duplicated MOSs TR3 coupled in parallel together.

For illustration, the transistors TR3 have a MOS height, for example, around 1.5 micrometers. As discussed above, the distance S4 ranges from about 0.001 to about 5 micrometers.

In some approaches, the distance between MOSs is about 5 micrometers due to deep n-well rule. With the configurations of the present disclosure, IL performance of the antenna switch is improved based on a process technique to shorten the distance between MOSs, without changing a circuit design of the antenna switch.

The configurations of FIG. 11 are given for illustrative purposes. Various implements are within the contemplated scope of the present disclosure. For example, in some embodiments, a number of the MOS configured with respect to the transistors TR3 are more than three.

Figure 12:
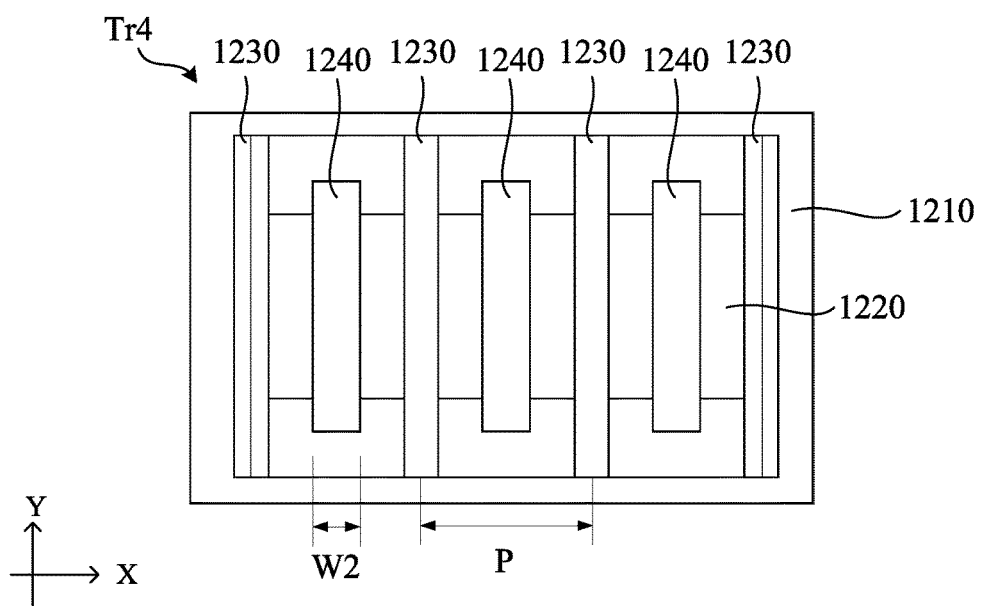
FIG. 12 is a top view diagram of part of a semiconductor device, in accordance with some embodiments.

Reference is now made to FIG. 12. FIG. 12 is a top view diagram of part of a semiconductor device 1200 corresponding to the semiconductor device 100 of FIG. 1, in accordance with some embodiments. For illustration, the semiconductor device 1200 includes a substrate 1210, a doped region 1220, gates 1230, and conductive segments (metal-to-device, MD) 1240 in a transistor TR4. In some embodiments, the substrate 1210 is configured with respect to, for example, the substrate 110 of FIG. 1. The transistor TR4 is configured with respect to, for example, the MOS 120 of FIG. 1.

As shown in FIG. 12, the doped region 1220 extends in x direction on the substrate 1210. The gates 1230 extend in y direction and are separated from each other in x direction with a gate pitch P. The conductive segments 140, having a width W2, extend in y direction and are interposed between the gates 1230. In some embodiments, the gate pitch P ranges from about 100 to about 220 nanometers. The width W2 is about 40 nanometers.

With the configurations of FIG. 12, due to the enlarged gate pitch, the mobility of the MOS is enhanced and the parasitic capacitance generated between gates is reduced. Accordingly, the IL and isolation of an antenna switch included in the semiconductor device 1200 are both improved. For example, based on experiment results, an IL of an antenna switch reduces about 1.0 dB as the gate pitch thereof is enlarged from about 90 nanometers to 130 nanometers. Furthermore, having the enlarged conductive segment width contributes the improvement of the IL as well. For example, based on experiment results, an IL of an antenna switch reduces about 0.03 dB as the width of the conductive segments thereof is enlarged from about 24 nanometers to 40 nanometers. In some embodiments of the present disclosure, as the gate pitch is enlarged by about 30% of the original design, the IL of the antenna switch exhibits a significant improvement.

The configurations of FIG. 12 are given for illustrative purposes. Various implements are within the contemplated scope of the present disclosure. For example, in some embodiments, the doped region 1220 is implemented with separated doped regions.

Figure 13:
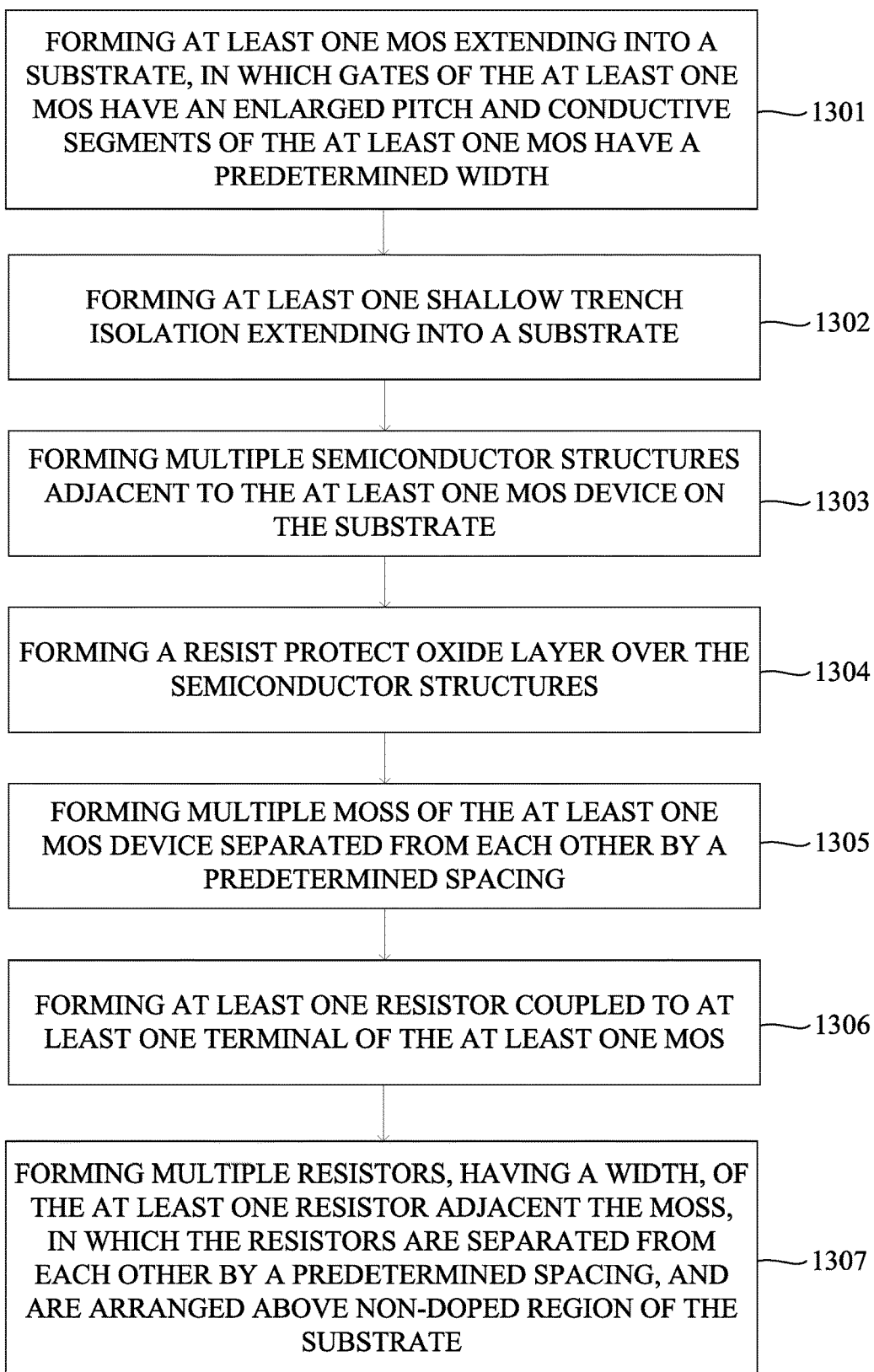
FIG. 13 is a flow chart of a method of fabricating a semiconductor device, in accordance with some embodiments of the present disclosure.

Reference is now made to FIG. 13. FIG. 13 is a flow chart of a method 1300 of fabricating the semiconductor devices 100, 200, 300, 400, 700, 800, 900, 1000, 1100, or 1200, in accordance with some embodiments of the present disclosure. It is understood that additional operations can be provided before, during, and after the processes shown by FIG. 13, and some of the operations described below can be replaced or eliminated, for additional embodiments of the method 1300. The method 1300 includes operations 1301-1307. The order of the operations shown in FIG. 13 may be changed according to different embodiments of the present disclosure.

In operation 1301, at least one MOS extending into a substrate is formed, as shown in the embodiments of, for example, FIGS. 6-10. In some embodiments, gates of the at least one MOS have an enlarged pitch and conductive segments of the at least one MOS have a predetermined width, as shown in the embodiments of, for example, FIG. 12.

In operation 1302, at least one shallow trench isolation extending into the substrate is formed, as shown in the embodiments of, for example, FIGS. 6-10.

In operation 1303, multiple semiconductor structures adjacent to the at least one MOS device on the substrate are formed, as shown in the embodiments of, for example, FIGS. 2-3.

In operation 1304, a resist protect oxide layer over the semiconductor structures is formed, as shown in the embodiments of, for example, FIG. 3.

In operation 1305, multiple MOSs of the at least one MOS device separated from each other by a predetermined spacing are formed, as shown in the embodiments of, for example, FIGS. 5 and 11.

In operation 1306, at least one resistor coupled to at least one terminal of the at least one MOS, as shown in the embodiments of, for example, FIG. 4.

In operation 1307, multiple resistors of the at least one resistor adjacent the MOSs are formed, as shown in the embodiments of, for example, FIG. 5. In some embodiments, the resistors are separated from each other by a predetermined spacing, as shown in the embodiments of, for example, FIGS. 5 and 11. In various embodiments, each of the resistors has a width, as shown in the embodiments of, for example, FIG. 5. In various embodiments, the resistors are arranged above non-doped region of the substrate, as shown in the embodiments of, for example, FIGS. 6-8.

Figure 14:
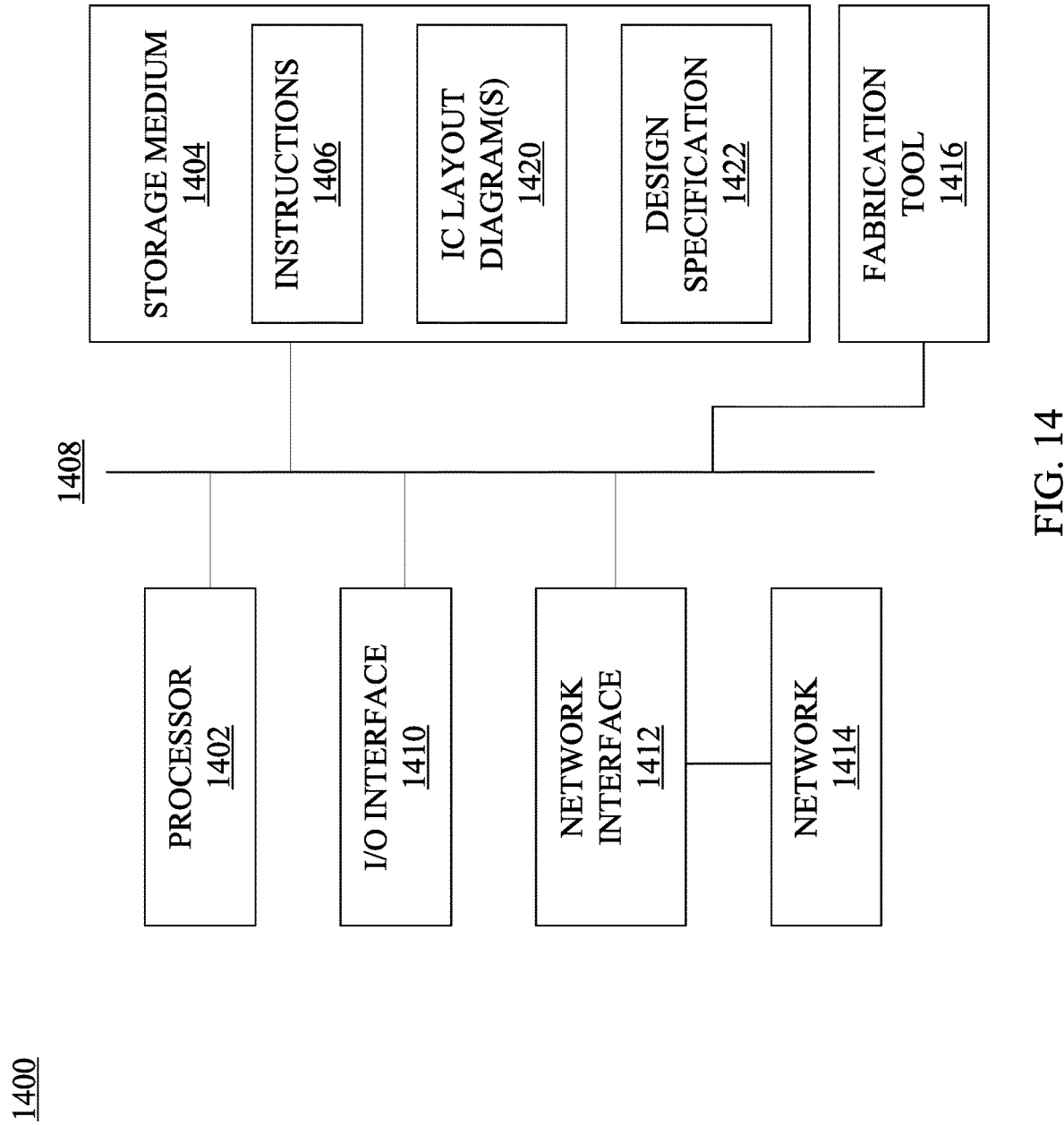
FIG. 14 is a block diagram of a system for designing the integrated circuit layout design, in accordance with some embodiments of the present disclosure.

Reference is now made to FIG. 14. FIG. 14 is a block diagram of electronic design automation (EDA) system 1400 for designing the integrated circuit layout design, in accordance with some embodiments of the present disclosure. EDA system 1400 is configured to implement one or more operations of the method 1300 disclosed in FIG. 13, and further explained in conjunction with FIGS. 1-12. In some embodiments, EDA system 1400 includes an APR system.

In some embodiments, EDA system 1400 is a general purpose computing device including a hardware processor 1402 and a non-transitory, computer-readable storage medium 1404. Storage medium 1404, amongst other things, is encoded with, i.e., stores, computer program code (instructions) 1406, i.e., a set of executable instructions. Execution of instructions 1406 by hardware processor 1402 represents (at least in part) an EDA tool which implements a portion or all of, e.g., the method 1300.

The processor 1402 is electrically coupled to computer-readable storage medium 1404 via a bus 1408. The processor 1402 is also electrically coupled to an I/O interface 1410 and a fabrication tool 1416 by bus 1408. A network interface 1412 is also electrically connected to processor 1402 via bus 1408. Network interface 1412 is connected to a network 1414, so that processor 1402 and computer-readable storage medium 1404 are capable of connecting to external elements via network 1414. The processor 1402 is configured to execute computer program code 1406 encoded in computer-readable storage medium 1404 in order to cause EDA system 1400 to be usable for performing a portion or all of the noted processes and/or methods. In one or more embodiments, processor 1402 is a central processing unit (CPU), a multi-processor, a distributed processing system, an application specific integrated circuit (ASIC), and/or a suitable processing unit.

In one or more embodiments, computer-readable storage medium 1404 is an electronic, magnetic, optical, electromagnetic, infrared, and/or a semiconductor system (or apparatus or device). For example, computer-readable storage medium 1404 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1404 includes a compact disk-read only memory (CD-ROM), a compact disk-read/write (CD-R/W), and/or a digital video disc (DVD).

In one or more embodiments, storage medium 1404 stores computer program code 1406 configured to cause EDA system 1400 (where such execution represents (at least in part) the EDA tool) to be usable for performing a portion or all of the noted processes and/or methods. In one or more embodiments, storage medium 1404 also stores information which facilitates performing a portion or all of the noted processes and/or methods. In one or more embodiments, storage medium 1404 stores IC layout diagram 1420 of standard cells including such standard cells as disclosed herein, for example, a cell including in the semiconductor devices 100, 200, 300, 400, 700, 800, 900, 1000, 1100, 1200 discussed above with respect to FIGS. 1-12.

EDA system 1400 includes I/O interface 1410. I/O interface 1410 is coupled to external circuitry. In one or more embodiments, I/O interface 1410 includes a keyboard, keypad, mouse, trackball, trackpad, touchscreen, and/or cursor direction keys for communicating information and commands to processor 1402.

EDA system 1400 also includes network interface 1412 coupled to processor 1402. Network interface 1412 allows EDA system 1400 to communicate with network 1414, to which one or more other computer systems are connected. Network interface 1412 includes wireless network interfaces such as BLUETOOTH, WIFI, WIMAX, GPRS, or WCDMA; or wired network interfaces such as ETHERNET, USB, or IEEE-1464. In one or more embodiments, a portion or all of noted processes and/or methods are implemented in two or more systems 1400.

EDA system 1400 also includes the fabrication tool 1416 coupled to processor 1402. The fabrication tool 1416 is configured to fabricate integrated circuits, e.g., the semiconductor devices 100, 200, 300, 400, 700, 800, 900, 1000, 1100, 1200 discussed above with respect to FIGS. 1-12 illustrated in FIGS. 1-12, according to the design files processed by the processor 1402.

EDA system 1400 is configured to receive information through I/O interface 1410. The information received through I/O interface 1410 includes one or more of instructions, data, design rules, libraries of standard cells, and/or other parameters for processing by processor 1402. The information is transferred to processor 1402 via bus 1408. EDA system 1400 is configured to receive information related to a UI through I/O interface 1410. The information is stored in computer-readable medium 1404 as design specification 1422.

In some embodiments, a portion or all of the noted processes and/or methods are implemented as a standalone software application for execution by a processor. In some embodiments, a portion or all of the noted processes and/or methods are implemented as a software application that is a part of an additional software application. In some embodiments, a portion or all of the noted processes and/or methods are implemented as a plug-in to a software application. In some embodiments, at least one of the noted processes and/or methods are implemented as a software application that is a portion of an EDA tool. In some embodiments, a portion or all of the noted processes and/or methods are implemented as a software application that is used by EDA system 1400. In some embodiments, a layout diagram which includes standard cells is generated using a suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 15:
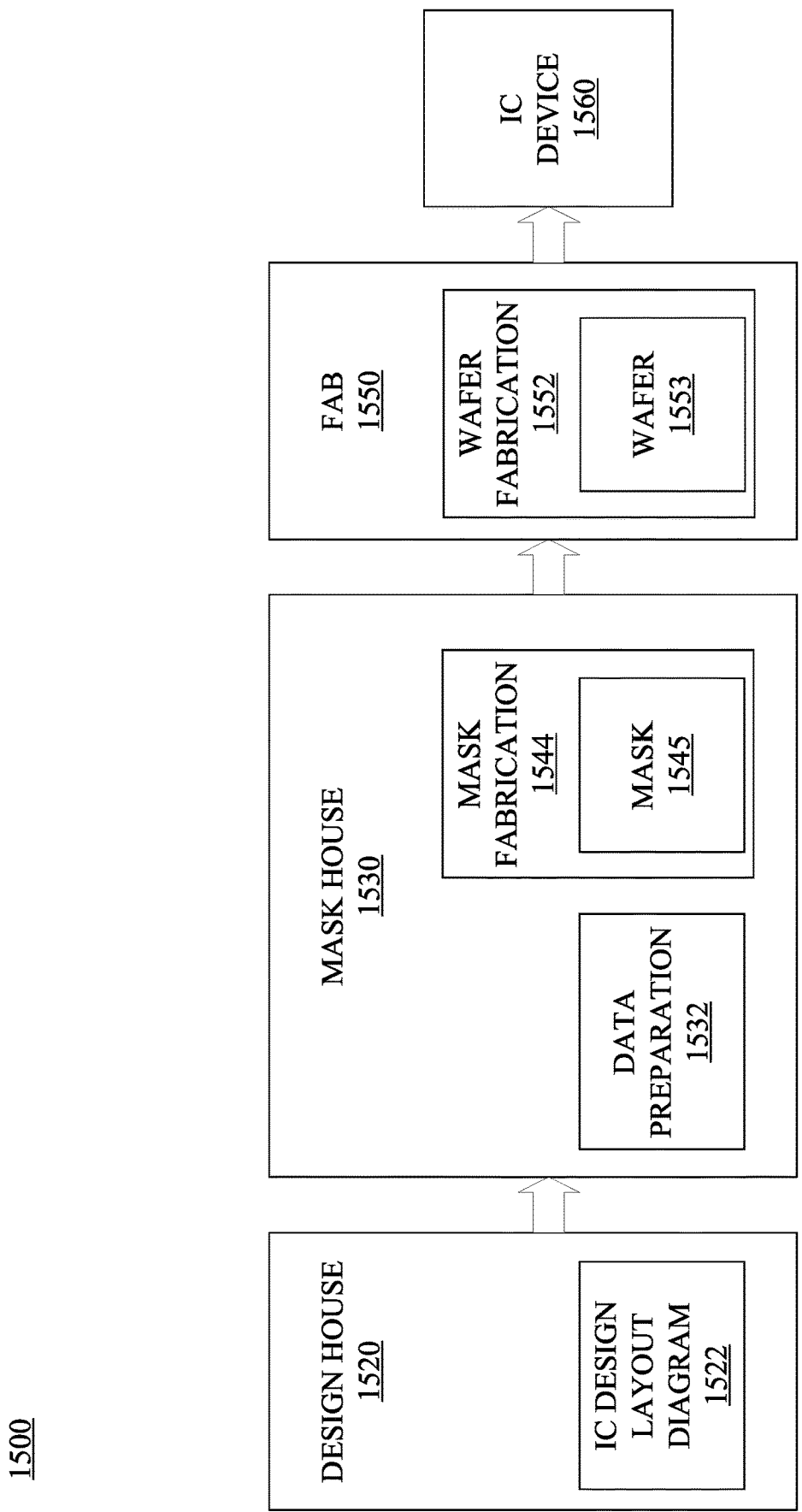
FIG. 15 is a block diagram of an integrated circuit manufacturing system, and an integrated circuit manufacturing flow associated therewith, in accordance with some embodiments.

FIG. 15 is a block diagram of IC manufacturing system 1500, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 1500.

In FIG. 15, IC manufacturing system 1500 includes entities, such as a design house 1520, a mask house 1530, and an IC manufacturer/fabricator ("fab") 1550, that interact with one another in the design, development, and manufacturing cycles and/or services related to manufacturing an IC device 1560. The entities in IC manufacturing system 1500 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1520, mask house 1530, and IC fab 1550 is owned by a single entity. In some embodiments, two or more of design house 1520, mask house 1530, and IC fab 1550 coexist in a common facility and use common resources.

Design house (or design team) 1520 generates an IC design layout diagram 1522. IC design layout diagram 1522 includes various geometrical patterns, for example, an IC layout design for an IC device 1560, for example, the semiconductor devices 100, 200, 300, 400, 700, 800, 900, 1000, 1100, 1200 discussed above with respect to FIGS. 1-12 illustrated in FIGS. 1-12. The geometrical patterns correspond to patterns of metal, oxide, or semiconductor layers that make up the various components of IC device 1560 to be fabricated. The various layers combine to form various IC features. For example, a portion of IC design layout diagram 1522 includes various IC features, such as an active region, gate electrode, source and drain, conductive segments or vias of an interlayer interconnection, to be formed in a semiconductor substrate (such as a silicon wafer) and various material layers disposed on the semiconductor substrate. Design house 1520 implements a proper design procedure to form IC design layout diagram 1522. The design procedure includes one or more of logic design, physical design or place and route. IC design layout diagram 1522 is presented in one or more data files having information of the geometrical patterns. For example, IC design layout diagram 1522 can be expressed in a GDSII file format or DFII file format.

Mask house 1530 includes data preparation 1532 and mask fabrication 1544. Mask house 1530 uses IC design layout diagram 1522 to manufacture one or more masks 1545 to be used for fabricating the various layers of IC device 1560 according to IC design layout diagram 1522. Mask house 1530 performs mask data preparation 1532, where IC design layout diagram 1522 is translated into a representative data file ("RDF"). Mask data preparation 1532 provides the RDF to mask fabrication 1544. Mask fabrication 1544 includes a mask writer. A mask writer converts the RDF to an image on a substrate, such as a mask (reticle) 1545 or a semiconductor wafer 1553. The IC design layout diagram 1522 is manipulated by mask data preparation 1532 to comply with particular characteristics of the mask writer and/or requirements of IC fab 1550. In FIG. 15, data preparation 1532 and mask fabrication 1544 are illustrated as separate elements. In some embodiments, data preparation 1532 and mask fabrication 1544 can be collectively referred to as mask data preparation.

In some embodiments, data preparation 1532 includes optical proximity correction (OPC) which uses lithography enhancement techniques to compensate for image errors, such as those that can arise from diffraction, interference, other process effects and the like. OPC adjusts IC design layout diagram 1522. In some embodiments, data preparation 1532 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 1532 includes a mask rule checker (MRC) that checks the IC design layout diagram 1522 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1522 to compensate for limitations during mask fabrication 1544, which may undo part of the modifications performed by OPC in order to meet mask creation rules.

In some embodiments, data preparation 1532 includes lithography process checking (LPC) that simulates processing that will be implemented by IC fab 1550 to fabricate IC device 1560. LPC simulates this processing based on IC design layout diagram 1522 to create a simulated manufactured device, such as IC device 1560. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1522.

It should be understood that the above description of data preparation 1532 has been simplified for the purposes of clarity. In some embodiments, data preparation 1532 includes additional features such as a logic operation (LOP) to modify the IC design layout diagram 1522 according to manufacturing rules. Additionally, the processes applied to IC design layout diagram 1522 during data preparation 1532 may be executed in a variety of different orders.

After data preparation 1532 and during mask fabrication 1544, a mask 1545 or a group of masks 1545 are fabricated based on the modified IC design layout diagram 1522. In some embodiments, mask fabrication 1544 includes performing one or more lithographic exposures based on IC design layout diagram 1522. In some embodiments, an electron-beam (e-beam) or a mechanism of multiple e-beams is used to form a pattern on a mask (photomask or reticle) 1545 based on the modified IC design layout diagram 1522. Mask 1545 can be formed in various technologies. In some embodiments, mask 1545 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 1545 includes a transparent substrate (for example, fused quartz) and an opaque material (for example, chromium) coated in the opaque regions of the binary mask. In another example, mask 1545 is formed using a phase shift technology. In a phase shift mask (PSM) version of mask 1545, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1544 is used in a variety of processes. For example, such a mask(s) is used in an ion implantation process to form various doped regions in semiconductor wafer 1553, in an etching process to form various etching regions in semiconductor wafer 1553, and/or in other suitable processes.

IC fab 1550 includes wafer fabrication 1552. IC fab 1550 is an IC fabrication business that includes one or more manufacturing facilities for the fabrication of a variety of different IC products. In some embodiments, IC Fab 1550 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1550 uses mask(s) 1545 fabricated by mask house 1530 to fabricate IC device 1560. Thus, IC fab 1550 at least indirectly uses IC design layout diagram 1522 to fabricate IC device 1560. In some embodiments, semiconductor wafer 1553 is fabricated by IC fab 1550 using mask(s) 1545 to form IC device 1560. In some embodiments, the IC fabrication includes performing one or more lithographic exposures based at least indirectly on IC design layout diagram 1522. Semiconductor wafer 1553 includes a silicon substrate or other proper substrate having material layers formed thereon. Semiconductor wafer 1553 further includes one or more of various doped regions, dielectric features, multi-level interconnects, and the like (formed at subsequent manufacturing steps).

As described above, antenna switch including in the semiconductor device provided in the present disclosure has an improved insertion loss and isolation through implementing the features presented in the embodiments mentioned above without changing a circuit design of the antenna switch.

Also disclosed is a semiconductor device. The semiconductor device includes a substrate, a first metal-oxide-semiconductor device and a at least one first resistor. The substrate includes a non-doped region. The first metal-oxide-semiconductor device extends into the substrate. The first metal-oxide-semiconductor device is adjacent to the non-doped region. The at least one first resistor is disposed right above the non-doped region and arranged in a first row aligned with the first metal-oxide-semiconductor device in a first direction.

Also disclosed is a method. The method includes: forming at least one transistor extending into a substrate; forming a plurality of dummy structures adjacent to the at least one transistor; forming a first oxide portion above the plurality of dummy structures; and forming at least one resistor that is coupled to the at least one transistor, and is disposed above a non-doped region of the substrate.

Also disclosed is a semiconductor device. The semiconductor device includes a transistor, a first isolation, a first metal layer and a first resistor. The first isolation is adjacent to the transistor. The first metal layer is configured for metal routing of the transistor and disposed above the transistor and the first isolation. The first resistor is disposed between the first metal layer and the first isolation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate comprising a non-doped region;
   a first metal-oxide-semiconductor device extending into the substrate, wherein the first metal-oxide-semiconductor device is adjacent to the non-doped region in a first direction;
   at least one first resistor coupled to the first metal-oxide-semiconductor device,
   wherein the at least one first resistor is disposed right above the non-doped region in a second direction perpendicular to the first direction, and
   the at least one first resistor is further arranged in a first row aligned with the first metal-oxide-semiconductor device in the first direction in a plan view of the semiconductor device;
   a second metal-oxide-semiconductor device extending into the substrate, and separated from the first metal-oxide-semiconductor device along a third direction different from the first and second directions; and
   at least one second resistor disposed right above the non-doped region and arranged in a second row aligned with the second metal-oxide-semiconductor device in the first direction.

2. The semiconductor device of claim 1, wherein the at least one first resistor is one of a plurality of first resistors, wherein each of the plurality of first resistors has a width ranging from about 0.001 to about 10 micrometers and a minimum resistance of about 500 ohms.

3. The semiconductor device of claim 1, wherein the second metal-oxide-semiconductor device is separated from the first metal-oxide-semiconductor device by a distance ranging from about 0.001 to about 5 micrometers along the third direction.

4. The semiconductor device of claim 1, wherein the at least one first resistor is one of two first resistors separated from each other by a distance ranging from about 0.001 to about 10 micrometers along the first direction.

5. The semiconductor device of claim 1, wherein the at least one first resistor is one of two first resistors arranged on two opposite sides of the first metal-oxide-semiconductor device.

6. The semiconductor device of claim 1, further comprising:
   a plurality of metal-oxide-semiconductor devices,
   wherein the first metal-oxide semiconductor device and the second metal-oxide-semiconductor device are part of the plurality of metal-oxide-semiconductor devices; and
   wherein each of the plurality of metal-oxide-semiconductor devices is separated from an adjacent metal-oxide-semiconductor device by a predetermined spacing.

7. The semiconductor device of claim 1, further comprising:
   an isolation extending into the substrate,
   wherein the substrate further comprises a lower portion, and
   the non-doped region is interposed between the isolation and the lower portion.

8. A method, comprising:
   forming at least one transistor extending into a substrate;
   forming a plurality of dummy structures adjacent to the at least one transistor;
   forming a first oxide portion above the plurality of dummy structures; and
   forming at least one resistor that is coupled to the at least one transistor, and is disposed above a non-doped region of the substrate,
   wherein in a horizontal direction, the non-doped region is adjacent to a part extending into the substrate of the at least one transistor.

9. The method of claim 8, further comprising:
   forming a first isolation extending into the substrate, and between the at least one resistor and the non-doped region.

10. The method of claim 8, wherein forming the at least one transistor comprises:
    forming a plurality of transistors,
    wherein the at least one transistor is one of the plurality of transistors; and
    wherein each of the plurality of transistors is separated from an adjacent transistor by a predetermined spacing.

11. The method of claim 8, wherein forming at least one resistor comprises:
    forming a plurality of resistors,
    wherein the at least one resistor is one of the plurality of resistors; and
    wherein each of the plurality of resistors is separated from an adjacent resistor by a predetermined spacing.

12. The method of claim 8, wherein forming the plurality of dummy structures comprises:
    forming a first dummy structure;
    forming a second dummy structure separated from the first dummy structure by a first distance along a first direction;
    forming a third dummy structure separated from the first dummy structure by a second distance along a second direction different from the first direction; and
    forming a fourth dummy structure separated from the second dummy structure by the second distance along the second direction, and separated from the third dummy structure by the first distance along the first direction,
    wherein the second distance is larger than the first distance.

13. The method of claim 12, wherein forming the plurality of dummy structures further comprises:
    forming a fifth dummy structure separated from the third dummy structure by the second distance along the second direction; and
    forming a sixth dummy structure separated from the fourth dummy structure by the second distance along the second direction, and separated from the fifth dummy structure by the first distance along the first direction, wherein the third dummy structure is disposed between the first dummy structure and the fifth dummy structure.

14. The method of claim 8, wherein a first plurality of resistors are aligned with a first transistor along a first direction, and are separated from the first transistor along the first direction, wherein the at least one resistor is one of the first plurality of resistors;

a second plurality of resistors are aligned with a second transistor along the first direction, and are separated from the second transistor along the first direction, the first plurality of resistors are separated from the second plurality of resistors by a distance along a second direction different from the first direction, and the first transistor is separated from the second transistor by the distance along the second direction.

15. A semiconductor device, comprising:

a substrate comprising a non-doped region;

a first transistor adjacent to the non-doped region in a first direction;

a first resistor coupled to the transistor, wherein the first resistor is disposed above the non-doped region in a second direction perpendicular to the first direction, and the first resistor is disposed between a plurality of metal layers; and a plurality of first resistors that are arranged in a first row aligned with the first transistor in the first direction, wherein the first resistor is one of the plurality of first resistors.

16. The semiconductor device of claim 15, wherein each of the plurality of first resistors has a width ranging from about 0.001 to about 10 micrometers and has a minimum resistance of about 500 ohms.

17. The semiconductor device of claim 15, further comprising:

a second transistor separated from the first transistor along a third direction that is perpendicular to the first direction and is different from the second direction.

18. The semiconductor device of claim 17, further comprising:

a plurality of second resistors disposed right above the non-doped region and arranged in a second row aligned with the second transistor in the first direction.

19. The semiconductor device of claim 15, further comprising:

an isolation extending into the substrate, wherein the substrate further comprises a lower portion, and the non-doped region is interposed between the isolation and the lower portion.

20. The semiconductor device of claim 15, wherein each of the plurality of first resistors is separated from an adjacent resistor by a predetermined spacing.

* * * * *